(12) United States Patent
Beatson et al.

(10) Patent No.: US 7,320,424 B2
(45) Date of Patent: *Jan. 22, 2008

(54) LINEAR SPLIT AXIS WIRE BONDER

(75) Inventors: David T. Beatson, Kenneth Square, PA (US); E. Walter Frasch, Perkasie, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 138 days.

This patent is subject to a terminal disclaimer.

(21) Appl. No.: 11/092,399

(22) Filed: Mar. 29, 2005

(65) Prior Publication Data
US 2005/0247758 A1    Nov. 10, 2005

Related U.S. Application Data

(60) Provisional application No. 60/568,530, filed on May 5, 2004.

(51) Int. Cl.
B23K 37/00 (2006.01)
B23K 31/00 (2006.01)
B23K 31/02 (2006.01)

(52) U.S. Cl. .................................. 228/4.5; 228/180.5
(58) Field of Classification Search ................ 228/4.5, 228/180.5, 1.1, 6.1, 6.2; 219/56.21, 56.22
See application file for complete search history.

(56) References Cited

U.S. PATENT DOCUMENTS

| | | | |
|---|---|---|---|
| 4,266,710 A | 5/1981 | Bilane et al. | |
| 4,361,261 A * | 11/1982 | Elles et al. | 228/103 |
| 4,422,568 A * | 12/1983 | Elles et al. | 228/111 |
| 4,550,871 A | 11/1985 | Chan et al. | |
| 4,792,079 A | 12/1988 | Bansemir | |
| 5,156,318 A | 10/1992 | Suzuki et al. | |
| 5,699,951 A * | 12/1997 | Miyoshi | 228/4.5 |
| 5,735,449 A * | 4/1998 | Magni | 228/180.5 |
| 5,839,640 A | 11/1998 | Kinnaird | |
| 5,897,048 A | 4/1999 | Cheng | |
| 5,901,896 A | 5/1999 | Gal | |
| 5,909,837 A | 6/1999 | Safabakhsh et al. | |
| 5,931,372 A * | 8/1999 | Miller | 228/180.5 |
| 5,979,739 A * | 11/1999 | Jin et al. | 228/6.2 |
| 6,109,501 A | 8/2000 | Cheng et al. | |
| 6,122,307 A | 9/2000 | Koseki | |
| 6,126,432 A | 10/2000 | Okada et al. | |
| 6,434,726 B1 | 8/2002 | Goossen | |
| 6,460,751 B1 | 10/2002 | Thürlemann | |
| 6,616,030 B2 | 9/2003 | Miller | |
| 6,640,423 B1 * | 11/2003 | Johnson et al. | 29/740 |
| 6,774,651 B1 * | 8/2004 | Hembree | 324/758 |
| 6,913,838 B2 | 7/2005 | McCullough et al. | |

(Continued)

Primary Examiner—Jonathan Johnson
Assistant Examiner—Rachel E. Beveridge
(74) Attorney, Agent, or Firm—Christopher M. Spletzer, Sr.

(57) ABSTRACT

A wire bonding machine for bonding a wire to a semiconductor device. The wire bonding machine includes a wire bonding head having a bonding tool mounted to it. The bonding tool is adapted to attach a wire end to a semiconductor device. A bonding head conveyance system translates the bonding tool in a vertical direction and translates the bonding tool along a first horizontal axis. A work table supports at least one semiconductor device to be wire bonded. A work table conveyance system translates the semiconductor device along a second horizontal axis.

14 Claims, 11 Drawing Sheets

U.S. PATENT DOCUMENTS

2002/0162875 A1* 11/2002 Miller ................ 228/4.5
2003/0084563 A1* 5/2003 Ohkubo et al. ............ 29/740
2004/0129754 A1 7/2004 Suresh et al.
2005/0247758 A1* 11/2005 Beatson et al. ............ 228/103

* cited by examiner

LINEAR SPLIT AXIS WIRE BONDER

RELATED APPLICATIONS

This application is related to and claims priority from U.S. Provisional Application Ser. No. 60/568,530, filed May 5, 2004, the disclosure of which is incorporated herein by reference in its entirety.

FIELD OF THE INVENTION

The invention relates to the field of wire bonding equipment and, more particularly, to positioning of a bonding tool relative to a device.

BACKGROUND

Wire bonding processes and machines are used extensively as a practical and expedient method to bond wires to semiconductors. One example of the use of wire bonders in a semiconductor manufacturing process is for attaching a semiconductor die directly to a circuit substrate. The substrate includes numerous traces which terminate in pads that are positioned adjacent to the place where the die is to be mounted. The die itself includes numerous die pads that are to be electrically connected to the pads on the circuit board. A wire bonder is used to attach a conductive wire, typically having a diameter of between 0.00051 to 0.030 inches, to each die pad and then to the pads on the circuit board. The configuration of the die and the location of the pads require that the wire bonds be formed at varying X, Y and Z locations (i.e., in three dimensions).

Automatic wire bonders have been developed which utilize stored position data for each wire bond. The wire bonders use the position data to control the bonding operation. Common bonders use a wire bonding head that is linearly or rotatably displaceable in the Z direction (i.e., vertically) along with a semiconductor work table that is translatable in the X, Y directions. Three high-speed motors (one associated with each direction of movement) are used to position the semiconductor device and bonding tool at the appropriate locations.

Generally, the speed of a bonding machine is measured by the number of units that are completed per hour or the number of wires bonded per hour. One way to reduce the costs associated with the manufacture of a semiconductor product is to increase the speed of the bonding machine to increase the number of units produced per hour. The high speeds of current machines require the bonding head and the table to move at accelerations of between 10 and 12 g's. Increasing the accelerations above this range has been difficult due to the large mass and inertia that is involved in moving the various components of the bonding machines.

Therefore, it would be desirable to provide an improved high speed wire bonding machine.

SUMMARY

According to an exemplary embodiment of the present invention, a wire bonding machine for bonding a wire to a semiconductor device is provided. The wire bonding machine includes a wire bonding head having a bonding tool mounted to it. The bonding tool is adapted to attach a wire end to a semiconductor device. A bonding head conveyance system translates the bonding tool in a vertical direction and translates the bonding tool along a first horizontal axis. A work table supports at least one semiconductor device to be wire bonded. A work table conveyance system translates the semiconductor device in a second horizontal axis. According to another exemplary embodiment of the present invention, a method of bonding a wire to a device is provided. The method includes supporting a device to be wire bonded on a work table, and moving the device along a first horizontal axis with a work table conveyance system. The method also includes moving a wire bonding head with a bonding head conveyance system along a second horizontal axis and along a vertical axis. The method also includes bonding a wire to the device.

It is understood that the motion of the device along the work table by the work table conveyance system refers to movement during the wire bonding operation (e.g., precise movement). For example, a plurality of semiconductor devices (e.g., dies) may be brought into a general position on the work table. During the wire bonding operation, the work table conveyance system moves the devices along a horizontal axis to the precise position along that axis for bonding. According to certain exemplary embodiments of the present invention, the work table conveyance system may be combined with a general conveyance system for course movement of the devices into a general position along the horizontal axis.

The foregoing and other features of the invention and advantages of the present invention will become more apparent in light of the following detailed description of the exemplary embodiments, as illustrated in the accompanying figures. As will be realized, the invention is capable of modifications in various respects, all without departing from the invention. Accordingly, the drawings and the description are to be regarded as illustrative in nature, and not as restrictive.

BRIEF DESCRIPTION OF THE DRAWINGS

For the purpose of illustrating the invention, the drawings show a form of the invention that is presently preferred. However, it should be understood that this invention is not limited to the precise arrangements and instrumentalities shown in the drawings.

DETAILED DESCRIPTION

As used herein, the term semiconductor device refers to any of a number of devices including semiconductor dies, semiconductor chips, integrated circuits, substrates, PCBs, interconnect structures, etc., and any other device intended to be wire bonded.

As used herein, the terms "bonding head conveyance system" and "work table conveyance system" are intended to refer to any apparatus/mechanism(s) which can provide the desired motion. As such, they are not limited to the exemplary structures described herein.

Figure 1:
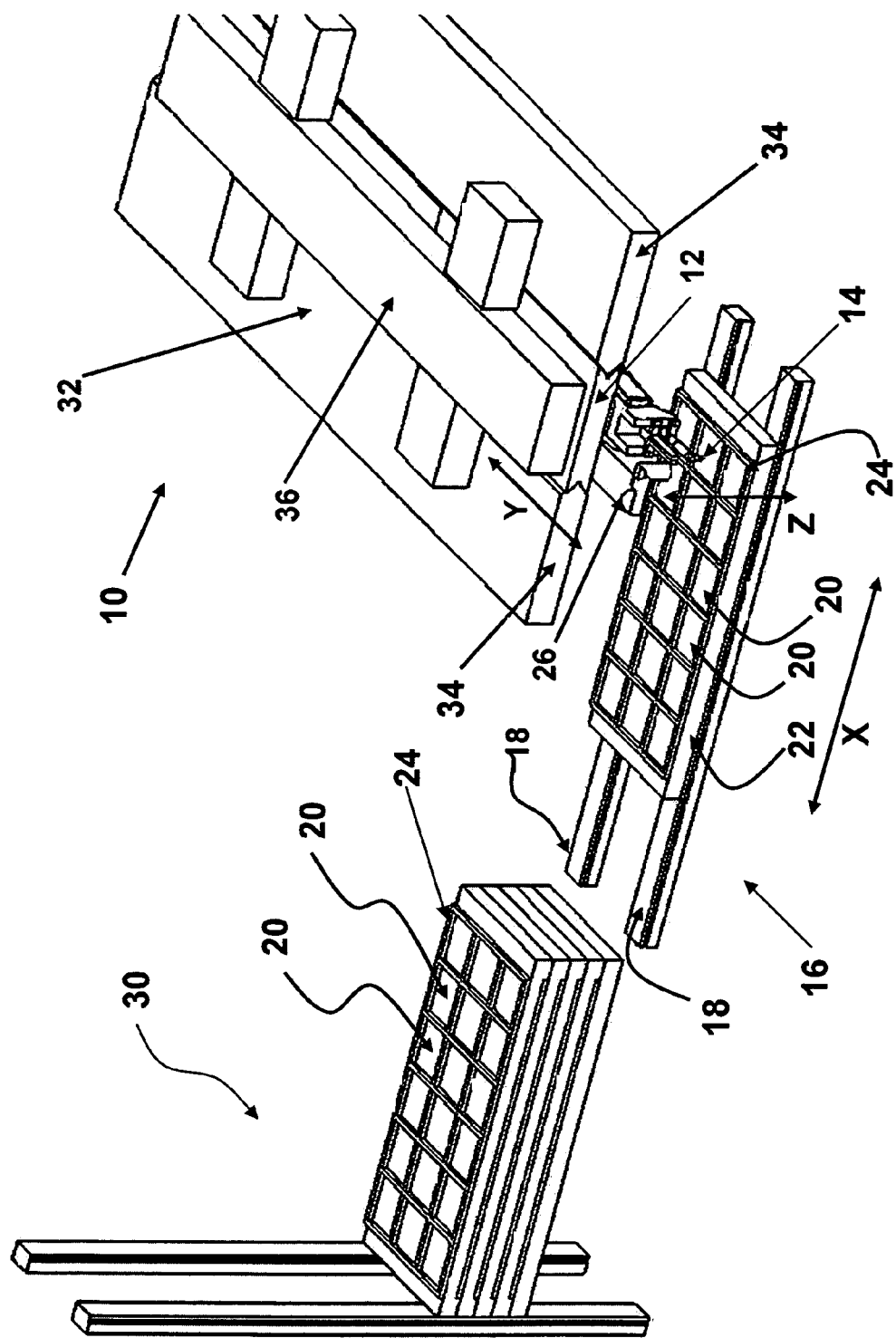
FIG. 1 is an isometric view of a wire bonding machine according to an exemplary embodiment of the present invention.
Figure 1A:
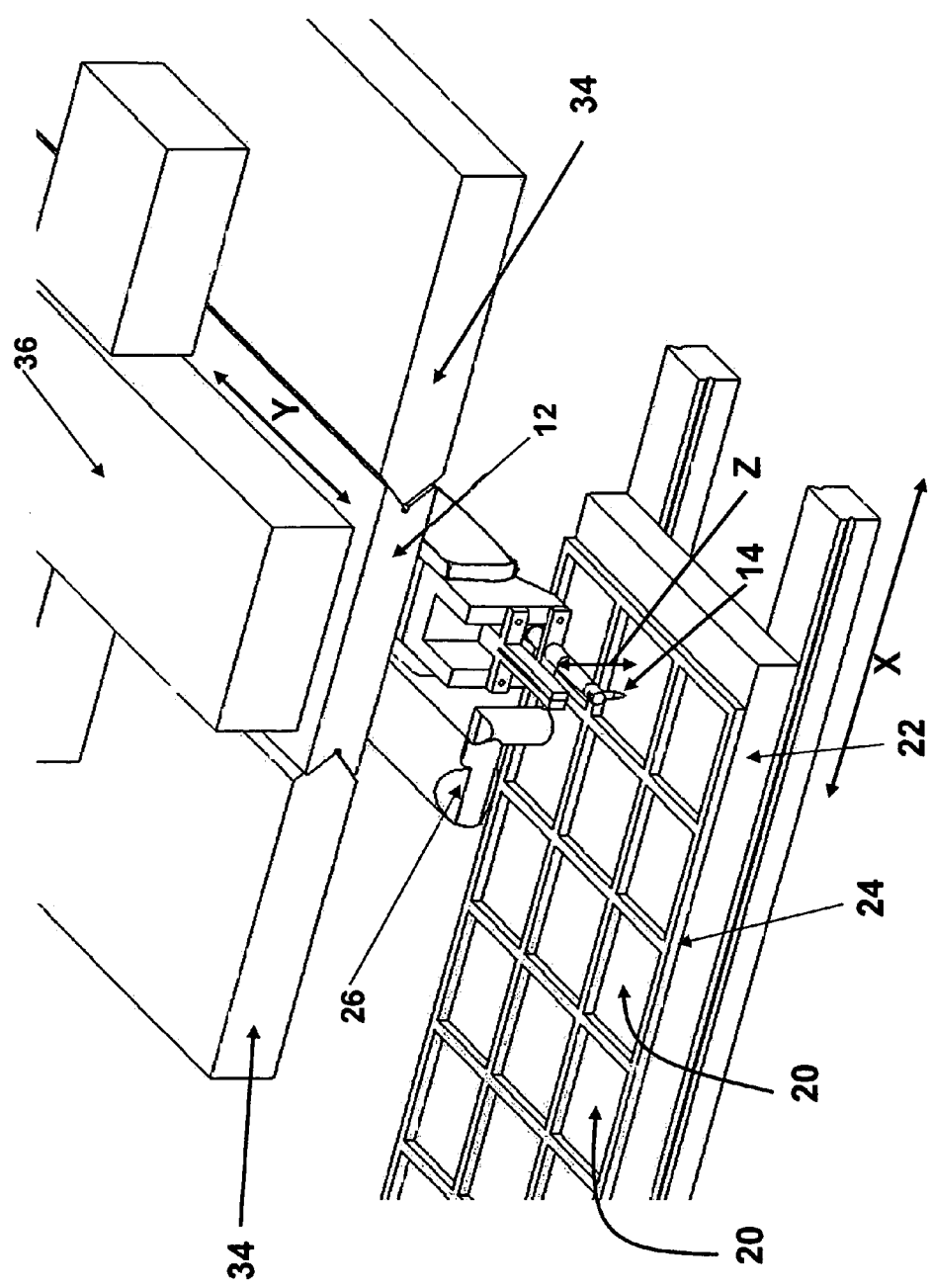
FIG. 1a is an enlargement of a portion of the wire bonding machine of FIG. 1.

Referring now to the drawings, wherein like reference numerals illustrate corresponding or similar elements throughout the several views, FIGS. 1 and 1a are isometric views of a portion of a wire bonding machine 10 according to an exemplary embodiment of the present invention. The wire bonding machine 10 includes a wire bonding head 12 which has a bonding tool 14 attached to it for dispensing and/or channeling a wire to a work piece 20 (e.g., substrate, PCB, die, chip, interconnect structure, etc.). Many of the detailed features of the wire bonding head 12 are conventional in the art and are not necessary for an understanding of the present invention. As such, no discussion is provided in this application. Similarly, many of the aspects of the wire bonding machine are conventional and, therefore, are also not described herein. Those skilled in the art are familiar with the general construction and arrangement of such components, and would be readily capable of applying the teachings provided herein to such machines.

The bonding head 12 is positioned above a high speed conveyance system 16, which, in the embodiment illustrated in FIGS. 1 and 1a, may include a conventional set of guide rails 18 and a motor drive (not shown), for translating the work piece 20 (e.g., a semiconductor device) relative to the bonding head 12. Any high-speed wire bonding conveyance system may be used in connection with the present invention. The work piece 20 is mounted on a work table 22 that includes a fixture 24 which holds one or more work pieces 20. A magazine handler 30 as shown in FIG. 1 may supply the fixture 24 (or magazine) to the high-speed conveyance system 16.

In the embodiment of FIGS. 1 and 1a, the work piece 20 is translated by the high speed conveyance system 16 in a direction parallel to an axis indicated by arrow "X." The bonding head 12 is translated by another high speed conveyance system 32 in a direction parallel to a different axis indicated by arrow "Y." The exemplary conveyance system 32 for the bonding head 12 shown in FIG. 1 includes guide rails 34 and a motor drive 36. In an exemplary embodiment, the motor drive for translating the bonding head 12 is driving in one direction only and is mounted directly to the bonding head 12.

The bonding head 12 is mounted to the bonding machine 10 through a conventional attachment which permits the bonding tool 14 to move vertically (i.e., in a direction parallel to an axis indicated by arrow "Z") relative to the work piece 20. U.S. Pat. No. 4,266,710, the disclosure of which is incorporated herein by reference in its entirety, describes one type of mounting arrangement that could be used in the present invention. The figures illustrate another embodiment. The mounting arrangement may include a pivot or hinge mount which permits the bonding tool 14 to move up and down in the Z-direction (toward and away from the work piece 20) to permit the bonding of the wires to the work piece 20 (e.g., semiconductor device 20) at various vertical positions. Those skilled in the art are familiar with such mounting arrangements as well as other mechanisms for vertical positioning of a bonding tool and, therefore, no further discussion is needed. Also attached to the bond head axis 12 is a camera/optics system 26 to extract position data used in the wire bonding process. The present invention can be readily incorporated into many conventional wire bonders, such as Kulicke and Soffa's 8028 Ball Bonder or Maxim IC Ball Bonder.

In a conventional X-Y axis system, the bearing system and drive motor for one axis, typically the Y-axis, must be carried by the other axis, thus dramatically increasing the dynamic vibration modes and more than doubling the driving load. In the embodiment shown in FIG. 1, the X-axis is orthogonal to the Y-axis and the X-axis and Y-axis are in parallel planes (i.e., horizontal planes) that are orthogonal to the Z-axis. The bonding machine 10 in FIG. 1 splits the X-axis positional control of the work piece 20 from the Y-axis and Z-axis positional control of the bonding head 12. This reduces the moving mass of the bonding head 12 to less than half of that of a conventional bonding head, in turn, reducing the power and dynamic requirements of the bonding machine 10.

Figure 2:
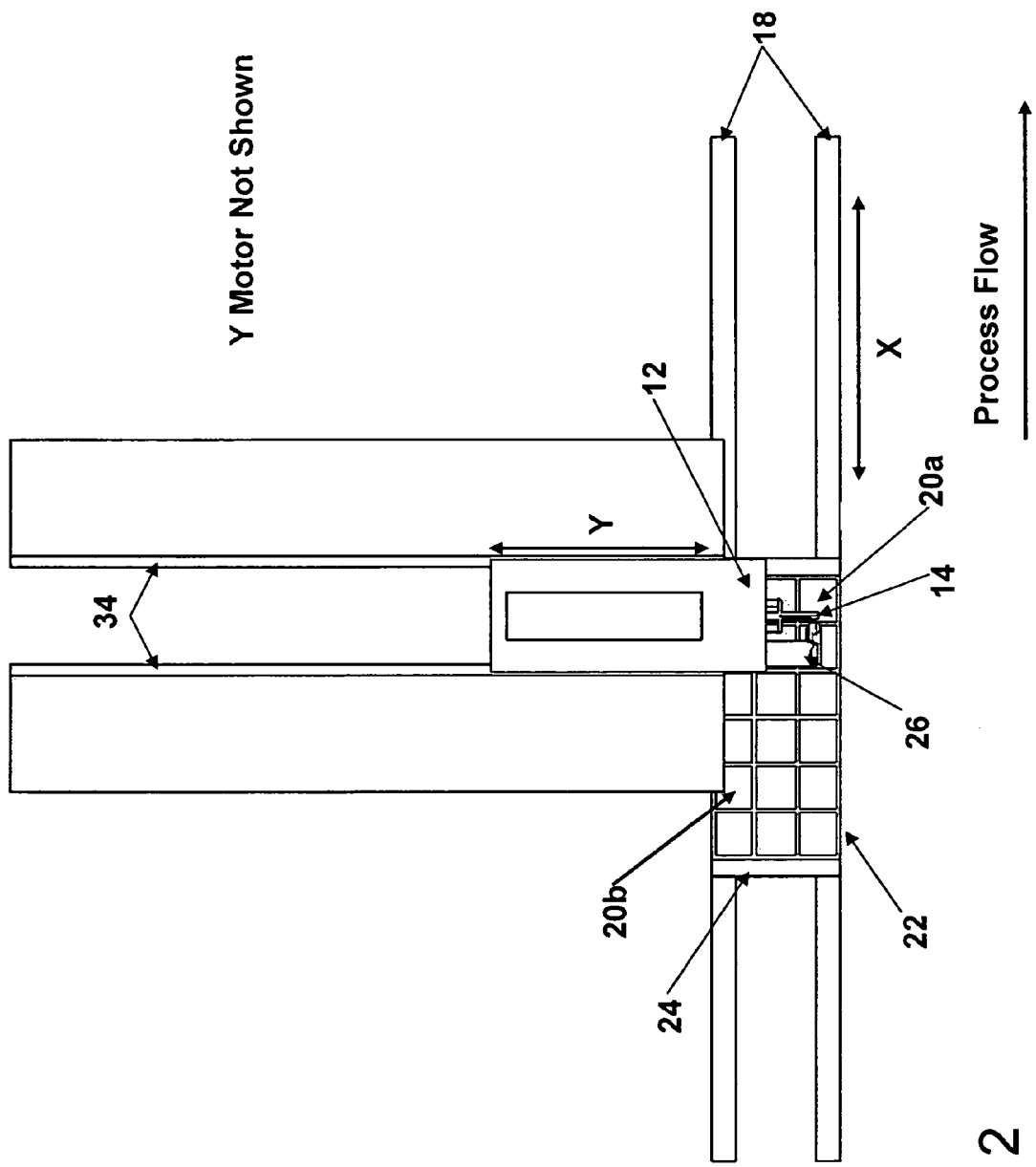
FIG. 2 is a top plan view of a wire bonding machine according to an exemplary embodiment of the present invention.
Figure 3:
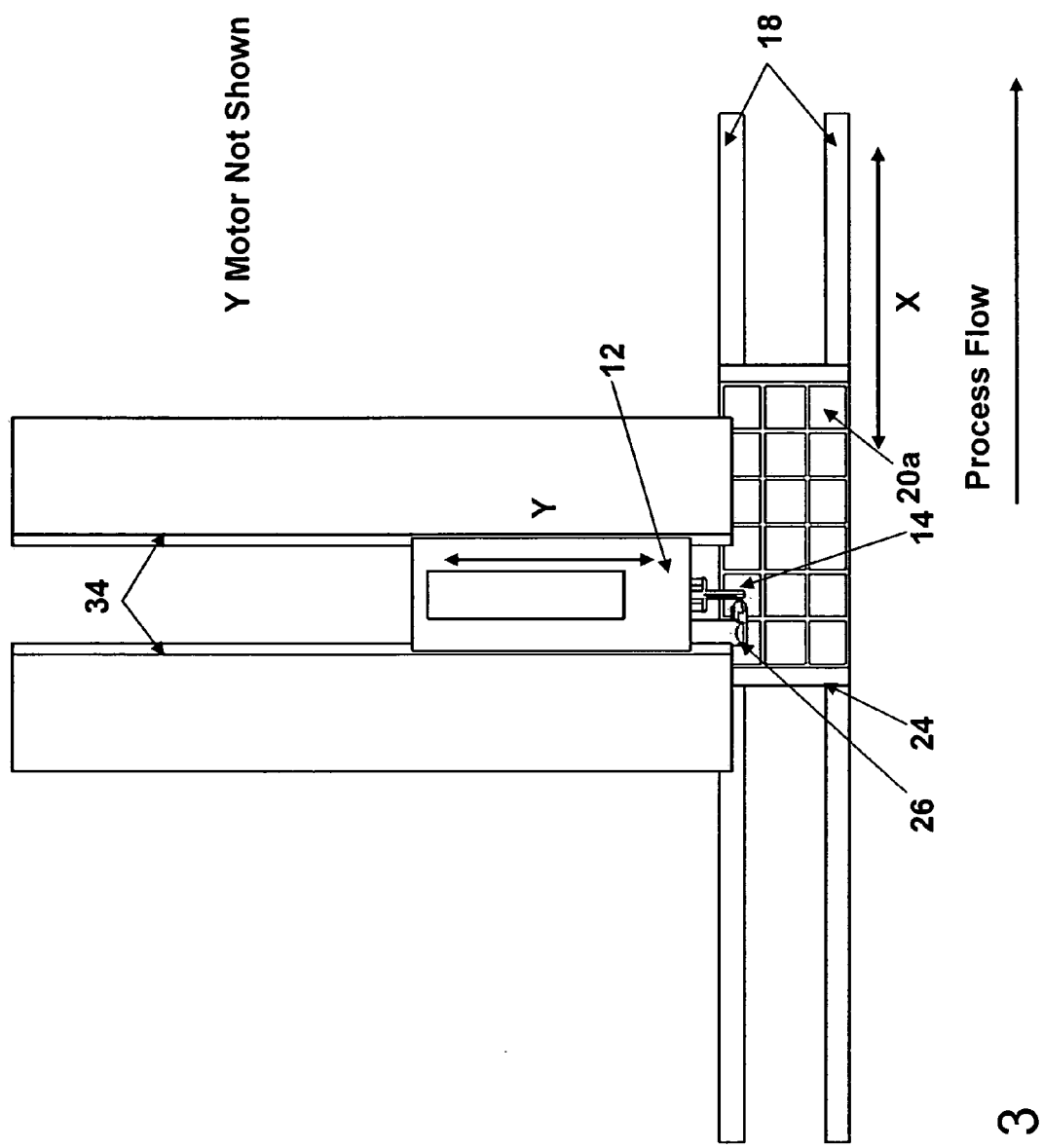
FIG. 3 is a top plan view of the wire bonding machine shown in FIG. 2 with the bonding head in a different position and aligned on a different work piece according to an exemplary embodiment of the present invention.

Referring to FIGS. 2-3, the motion of the bonding head 12 and work pieces 20a, 20b relative to each other is illustrated. FIG. 2 illustrates a first position of the bonding head 12 and, in particular the bonding tool 14, with respect to a work piece 20a. FIG. 3 illustrates a second position of the bonding head 12 and bonding tool 14 with respect to a work piece 20b.

In FIG. 2, the bonding head 12 is positioned so the bonding tool 14 is above the work piece 20a to perform a bonding operation on the work piece 20a. To perform a bonding operation on work piece 20b, the fixture 24 (with the work pieces 20) is moved along the X-axis (i.e., to the left in the drawing) and the bonding head 12 is moved along the Y-axis (i.e., upward in the drawing) to position the bonding tool 14 above work piece 20b.

As described above, the present invention controls translation of the work table 22 (and, thus, the work pieces 20) along the X-axis by translating the work table 22 along guide rails 18. It is contemplated that the rails 18 would preferably extend completely under the bonding head 12 such that the travel of the work table 22 would be along a linear path from the left side of the figures to the right side and out of the bonding machine 10. After work on the work pieces 20 of a fixture 24 is completed, the fixture 24 may travel to the right in the figures and out of the bonding machine 10 as the next fixture 24 travels into the bonding machine 10 from the left side.

Figure 4:
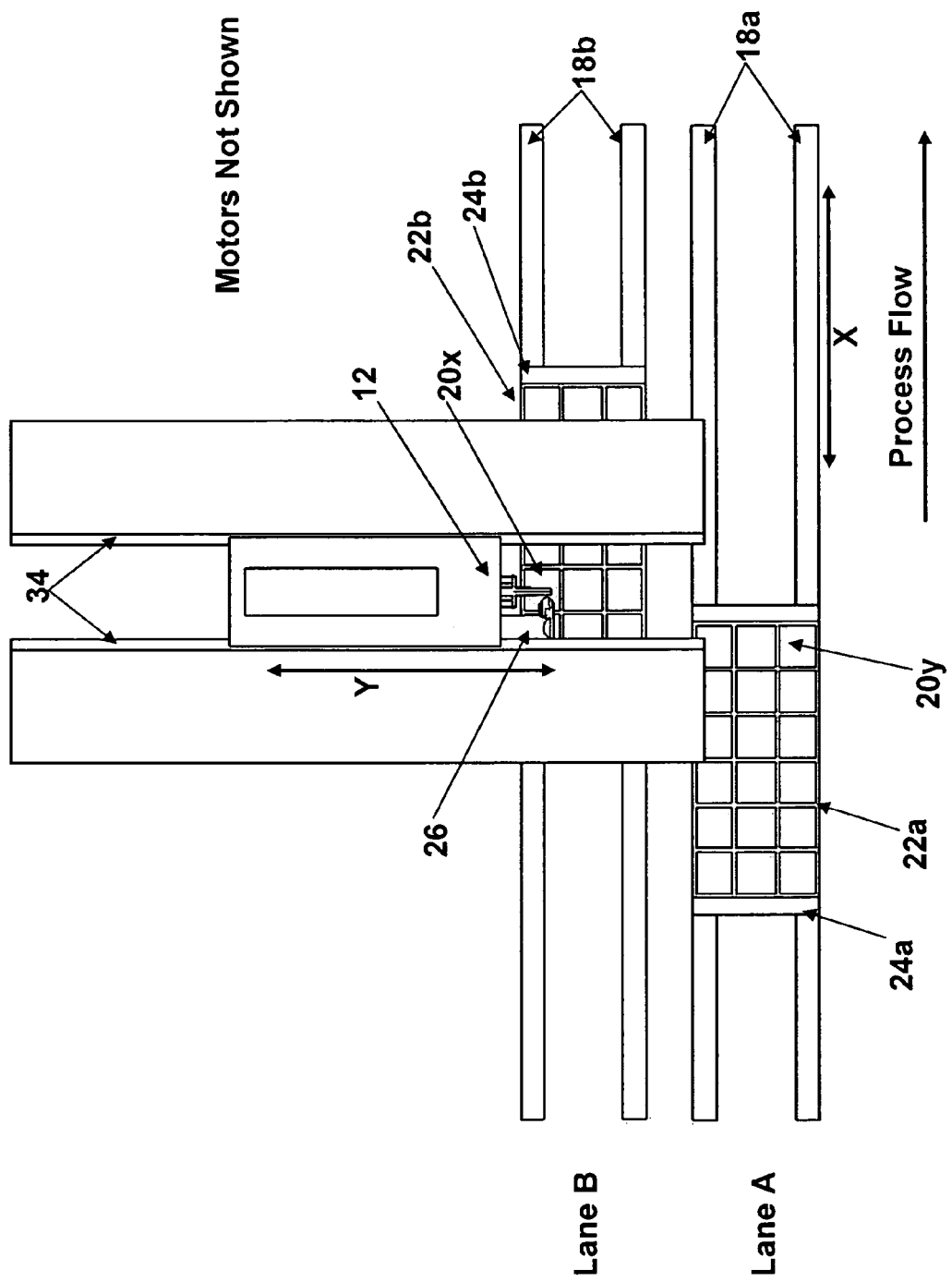
FIG. 4 is a top plan view of a wire bonding machine having two lanes for translating work pieces and the wire bonding head is aligned with a work piece in one lane (Lane B) according to an exemplary embodiment of the present invention.
Figure 5:
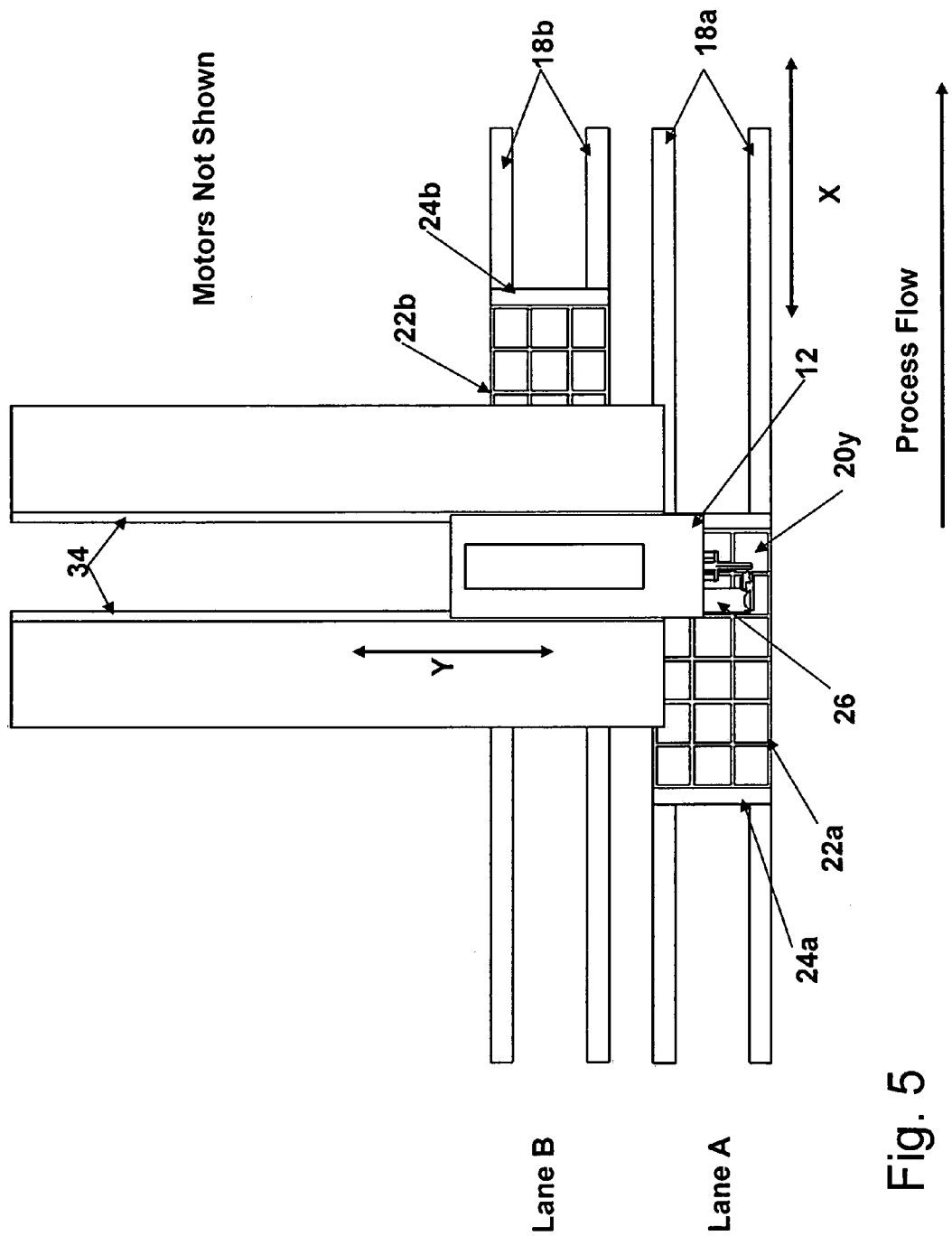
FIG. 5 is a top plan view of the wire bonding machine shown in FIG. 4 wherein the wire bonding head is aligned with a work piece in an other lane (Lane A) according to an exemplary embodiment of the present invention.

Referring now to FIGS. 4-5, there is shown a top plan view of a wire bonding machine 40 according an embodiment of the invention having two lanes, Lane A and Lane B, for translating work pieces 20. In this embodiment of the invention, there are two work tables 22a, 22b running in parallel, one in each of Lanes A and B. Lane A includes guide rails 18a and a motor drive (not shown) for translating the fixture 22a. Lane B includes guide rails 18b and a motor drive (not shown) for translating the fixture 22b.

Using multiple lanes speeds up the manufacturing process by moving the parts in and out of the bondable area in parallel without stopping the process of attaching wires. For example, with reference to FIG. 4, multiple work tables 22a, 22b in parallel allows the course movement of the work table 22a so the work piece 20y in Lane A can be moved into bonding position while the bonding head 12 is attaching wires on work piece 20x in Lane B.

In FIG. 4, the wire bonding head 12 is aligned with a work piece 20x in Lane 1. While the bonding head 12 is attaching wires to work piece 20x, the fixture 24a in Lane A is moved into bonding position. Once the wire bonding on work piece 20x is complete, the bonding head 12 is then moved into Lane A and aligned with work piece 20y in fixture 24a to attach wires to work piece 20y as shown in FIG. 5. While the bonding head 14 is attaching wires to the work pieces 20 in Lane A, the fixture 24b in Lane B can be moved out of the bonding machine 40 and a new fixture may be positioned in Lane B. The bonding machine 40 can similarly alternate between Lane A and Lane B to almost continuously attach wires without waiting for course positioning of a work piece 20.

Figure 6:
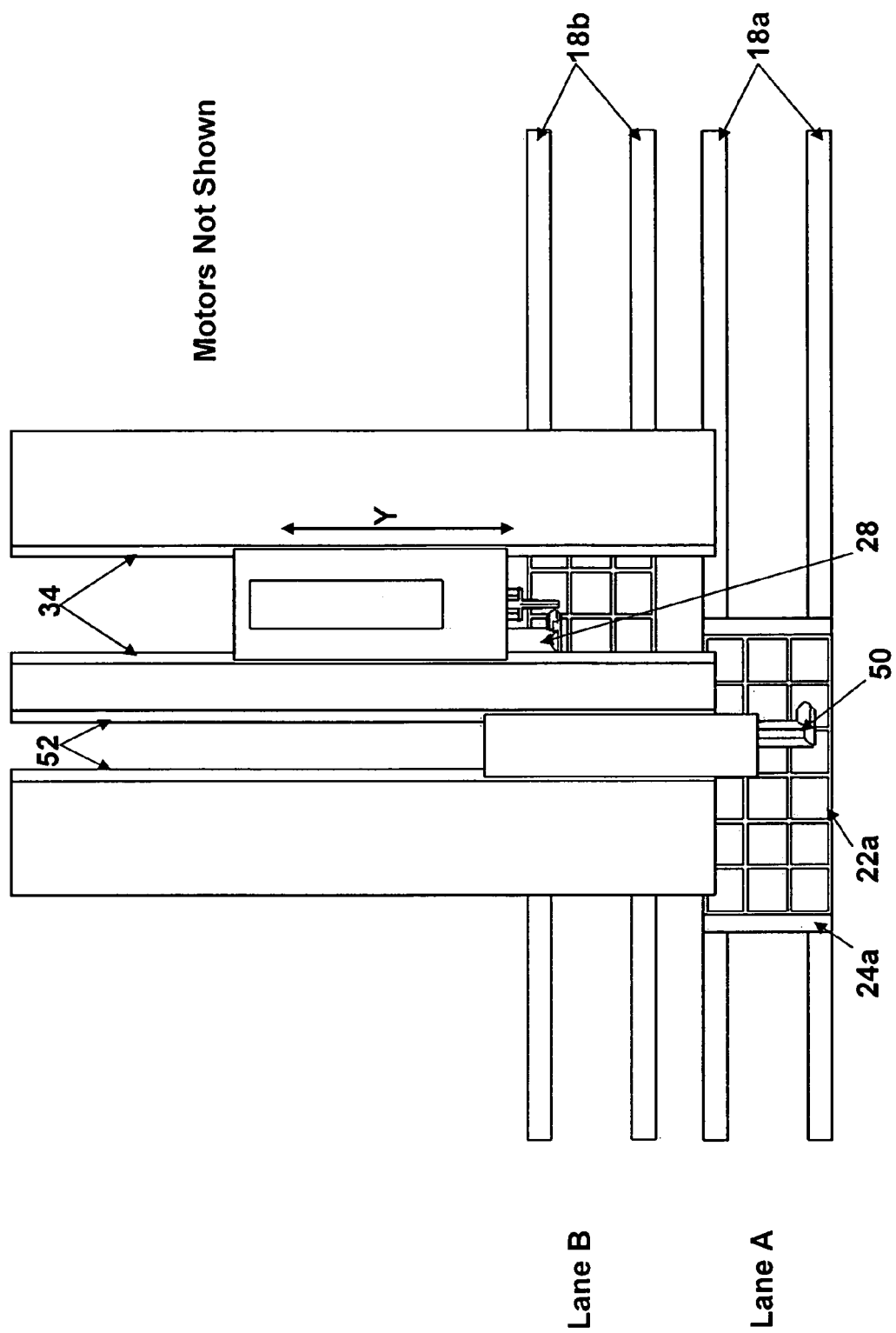
FIG. 6 is a top plan view of a wire bonding machine having two lanes for translating work pieces and a camera according to an exemplary embodiment of the present invention.

The bonding machine 60 in FIG. 6 includes a camera 50. The machine 60 also includes two parallel work tables 22a, 22b and the camera 50 is mounted to a conveyance system 52 that carries the camera 50 in a direction along the Y-axis. The machine 60 uses two work tables 22a, 22b that allow package indexing on one work table 22b while attaching wire bonds on the alternate work table 22a.

The camera 50 scans across either or both work tables 22a, 22b in the Y-direction as the tables 22a, 22b move the work pieces 20 along the X-axis. Conventional software is used to retrieve, store and extract position data for use by the bonding head. Accordingly, no further discussion of such software is needed. An additional simple fixed focus camera 28 may be mounted to the bonding head 12, such that it moves with the bonding head 12. The camera 50 is used to collect eyepoint and bond position data. The camera on the bonding head 12 is then used to verify the device location before attaching the wire bonds. This allows both indexing and vision recognition to be performed on one work table 22b while attaching wire bonds on the alternate work table 22a.

The camera 50 records/stores image data related to the work piece 20. Specifically, the camera 50 stores position data, such as X-Y location and orientation, of the work piece 20 and/or bonding locations on the work piece 20. The data is fed to a microprocessor or similar controller for use in controlling the bonding head 12 and bonding tool 14.

Referring to FIG. 6, the camera 50 acquires and processes the full vision data on one or more work pieces 20 on one work table 22a in Lane A while the bonding head 12 attaches wires on one or more work pieces on the other work table 22b in Lane B. When the wire bonding machine 60 has completed attaching the wires on the work piece(s) in Lane B, the upstream camera system has completed acquiring and processing all of the data required to attach the wires on the work piece(s) in Lane A. The bonding head 12 then moves to Lane B and only takes a registration image (fiducial) to begin attaching the wires on the work pieces in Lane A.

Figure 7:
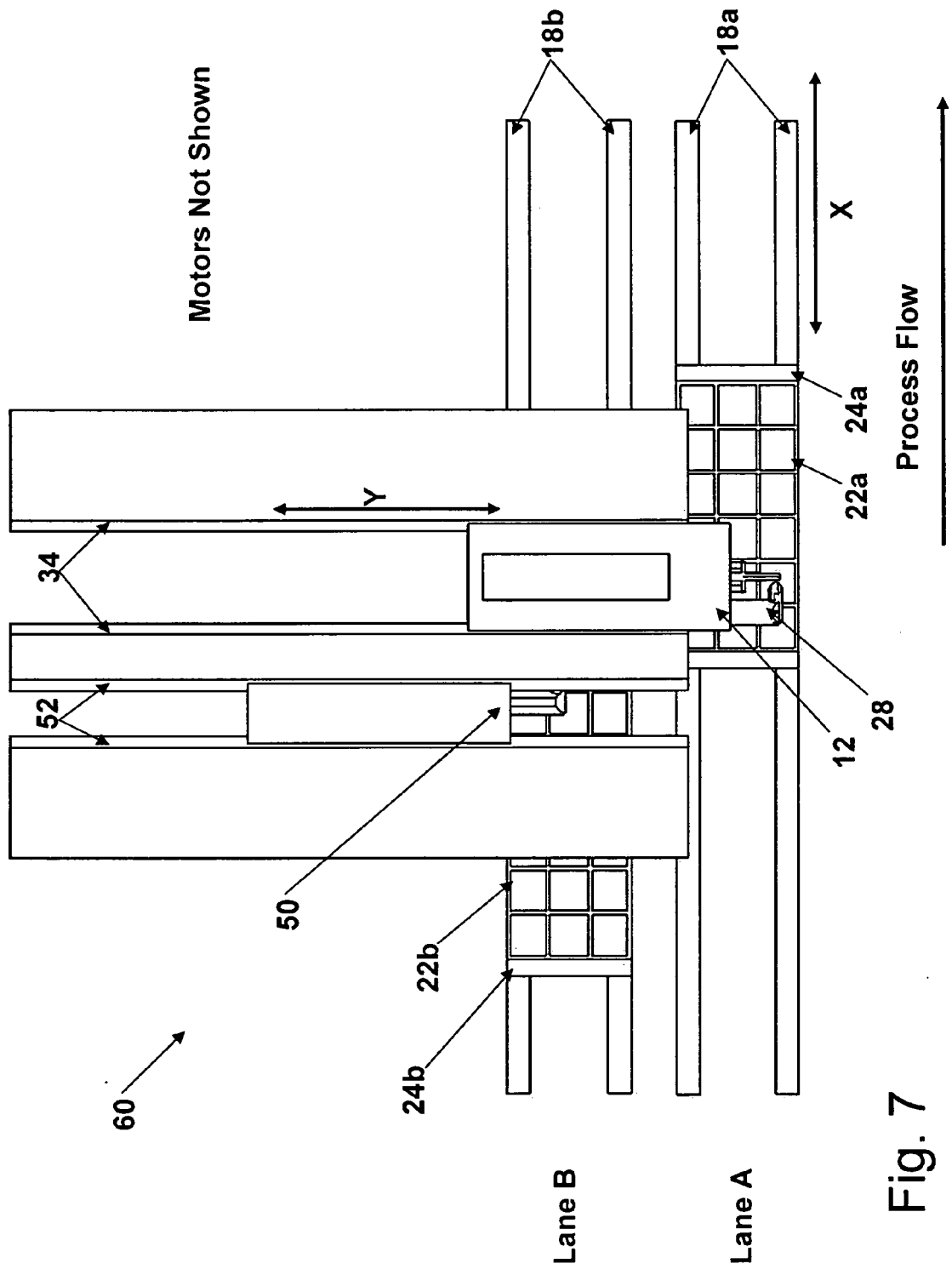
FIG. 7 is a top plan view of a wire bonding machine having two lanes for translating work pieces and a camera wherein the direction of movement of the bonding head and the work pieces in a horizontal plane with the bonding head and camera in different positions and aligned on different work pieces according to an exemplary embodiment of the present invention.

FIG. 7 shows these processes in the alternate lanes. These processes continuously alternate between Lane A and Lane B, thus overlapping the work table 22 transfer, image acquisition and processing with the attaching of wires. This can increase throughput of the machine by more than double, depending on the work piece 20 configuration.

Figure 8:
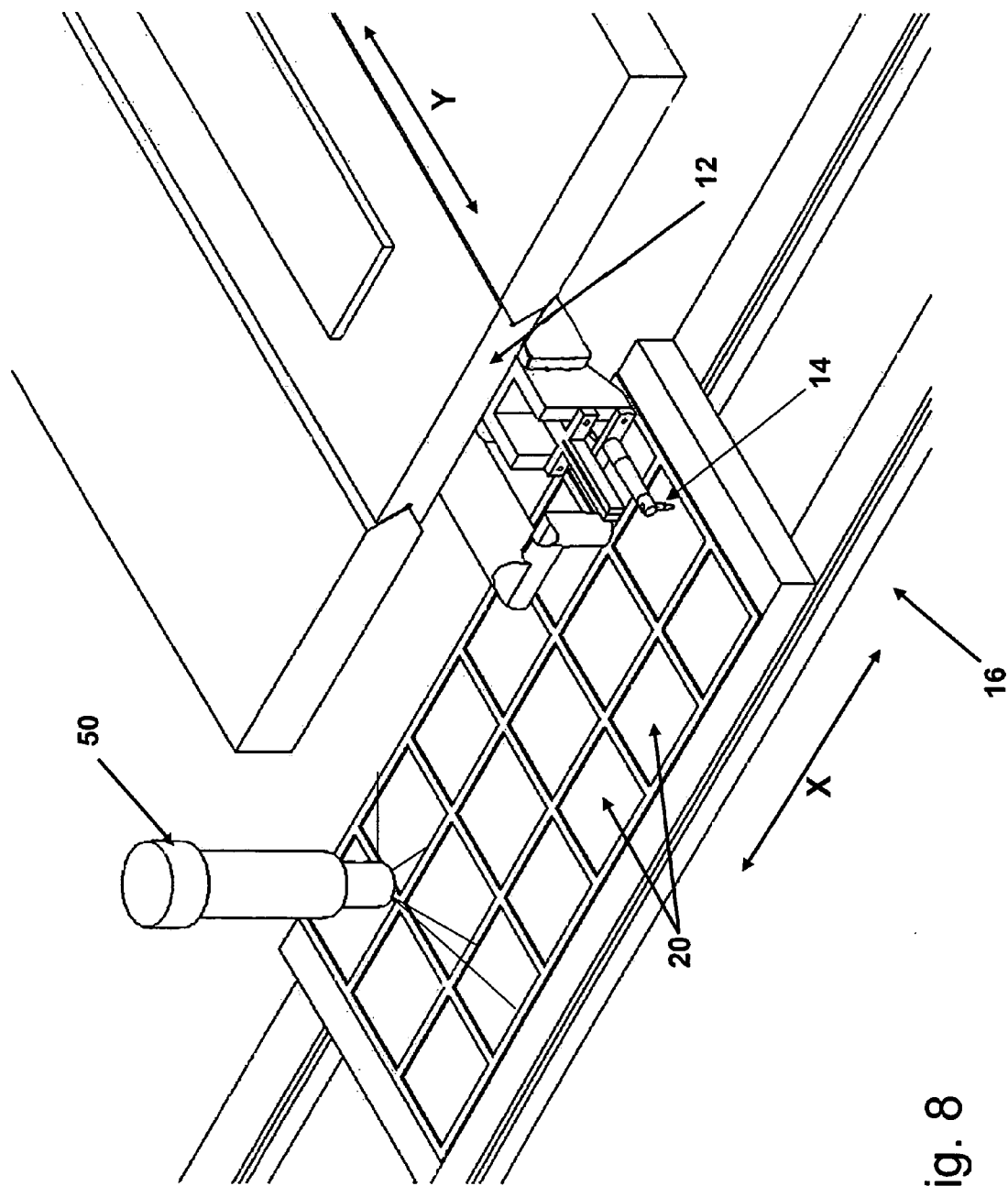
FIG. 8 is an isometric view of an another exemplary embodiment of the present invention with a fixed upstream camera.

In the embodiment shown in FIG. 8, the camera 50 is a fixed line scan camera. The camera does not move but, instead, retrieves information related to the entire table on a line by line basis as the down stream devices are being bonded.

Figure 9:
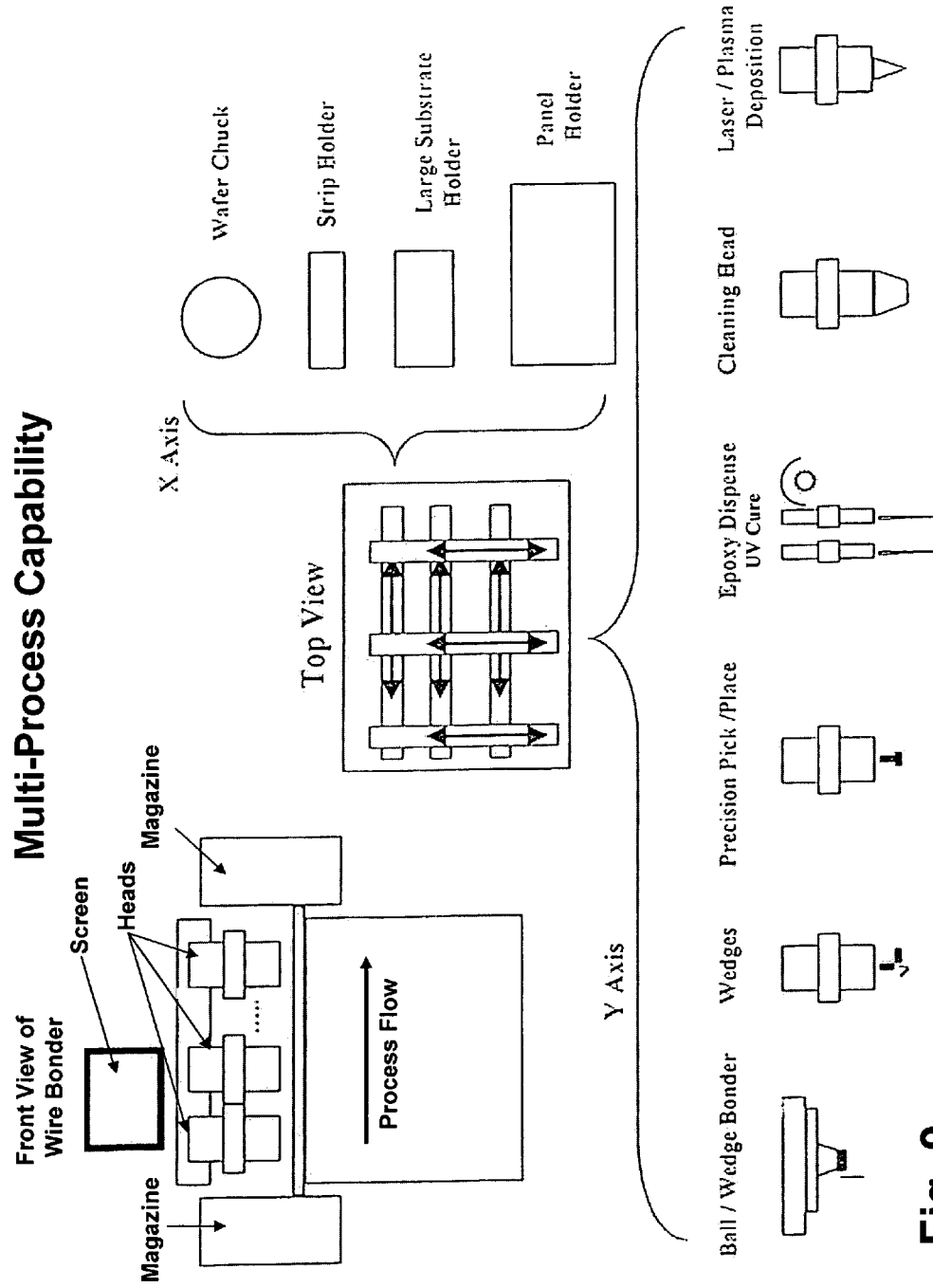
FIG. 9 is a schematic view of an exemplary embodiment of the present invention illustrating the multi-process capability provided by the invention.

While the above discussion has described the use of the present invention on a wire bonding head for forming wire interconnections, the invention can also be used with additional wire bonding devices, such as a ball/wedge bonder, a pick and place head, an epoxy dispenser and curing system, a cleaning head or a laser/plasma deposition head. FIG. 9 shows the multi-process capability of this invention. Those skilled in the art would be readily capable of implementing the present invention with any of these systems.

Figure 10:
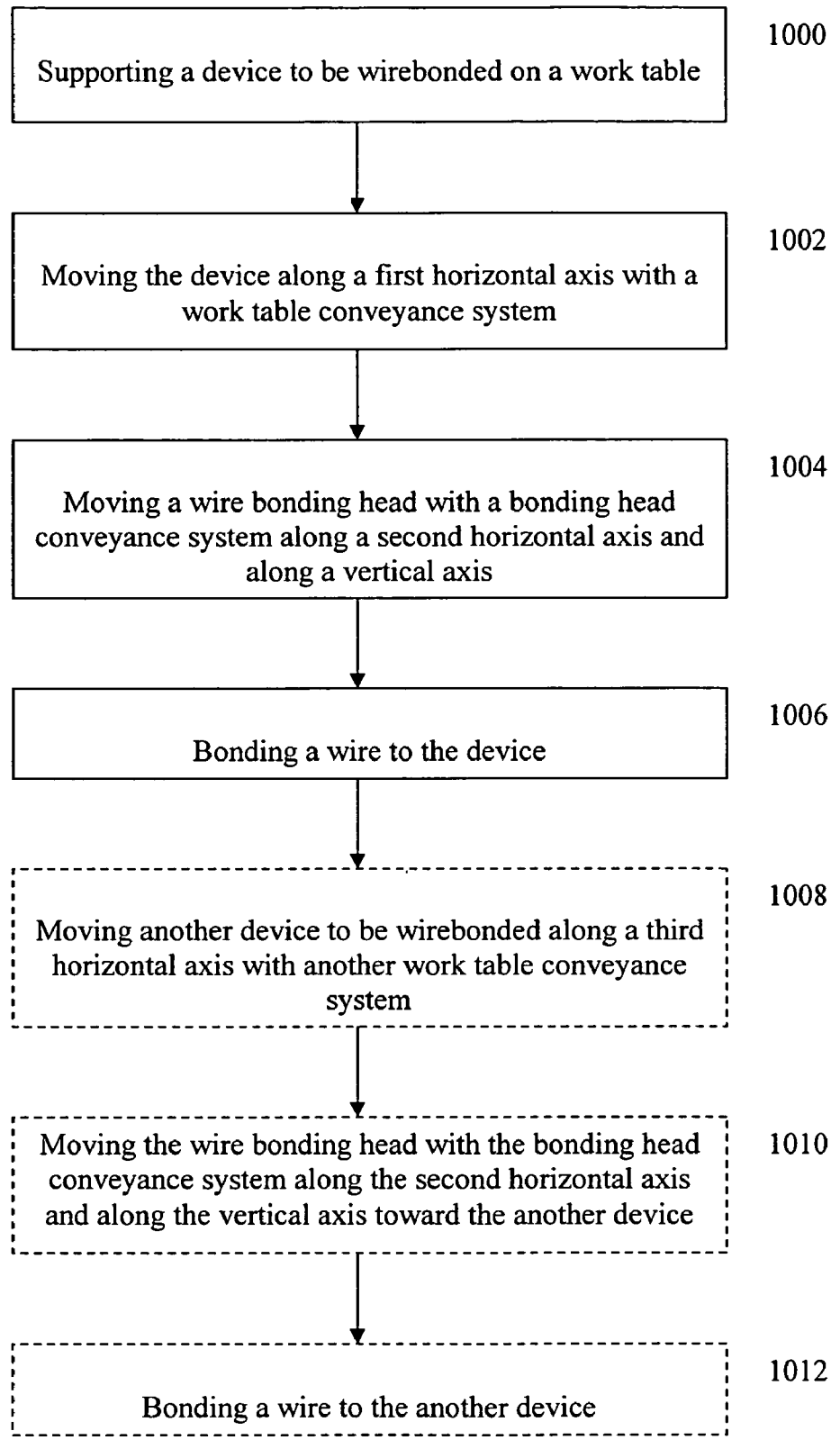
FIG. 10 is a flow diagram illustrating a method of bonding a wire to a device in accordance with an exemplary embodiment of the present invention.

FIG. 10 is a flow diagram illustrating a method of bonding a wire to a device. At step 1000, a device to be wire bonded (e.g., a PCB, a substrate, a die, a chip, an interconnect structure, etc.) is supported on a work table. At step 1002, the device is moved along a first horizontal axis with a work table conveyance system. At step 1004, a wire bonding head is moved along a second horizontal axis (e.g., an overhead horizontal axis) and along a vertical axis using a bonding head conveyance system. At step 1006, a wire is bonded to the device. At optional step 1008, another device to be wire bonded is moved along a third horizontal axis with another work table conveyance system. At optional step 1010, the wire bonding head is moved along the second horizontal axis and along the vertical axis using a bonding head conveyance system toward the another device. At optional step 1012, a wire is bonded to the another device.

The method illustrated in FIG. 10 may include other steps as described above with respect to the other embodiments of the present invention, for example, utilization of a camera in connection with the wire bonding operation. Further, it is clear that the order of the steps is not limited to that illustrated in FIG. 10.

The method described above with respect to FIG. 10 (with or without additional steps as described above) may be implemented in a number of alternative mediums. For example, the method may be installed on an existing computer system/server as software (a computer system used in connection with, or integrated with, a wire bonding machine). Further, the method may operate from a computer readable carrier (e.g., solid state memory, optical disc, magnetic disc, radio frequency carrier medium, audio frequency carrier medium, etc.) that includes computer instructions (e.g., computer program instructions) related to the method of bonding a wire to a device.

The present invention may be embodied in other specific forms without departing from the spirit or essential attributes thereof and, accordingly, reference should be made to the appended claims, rather than to the foregoing specification, as indicating the scope of the invention.

What is claimed is:

1. A wire bonding machine for bonding a wire to a semiconductor device, the wire bonding machine comprising:

a wire bonding head having a bonding tool mounted to it, the bonding tool adapted to attach a wire end to a semiconductor device;

a bonding head conveyance system adapted to (1) move the bonding tool in a vertical direction and (2) move the bonding tool linearly along a first horizontal axis during a wire bonding operation wherein the wire bonding operation is the process of attaching a conductive wire between bonding locations on the semiconductor device;

a work table adapted to support a semiconductor device to be wire bonded, and adapted to position the semiconductor device into a bonding position prior to the wire bonding operation; and a work table conveyance system adapted to translate the semiconductor device along a second horizontal axis during the wire bonding operation, wherein the second horizontal axis is different from the first horizontal axis, and wherein the translation of the semiconductor device during the wire bonding operation is distinct from the positioning of the semiconductor device into the bonding position.

2. The wire bonding machine according to claim 1 wherein the first horizontal axis and the second horizontal axis are substantially orthogonal to each other.

3. The wire bonding machine according to claim 1 wherein the first horizontal axis and the second horizontal axis are in substantially parallel planes.

4. The wire bonding machine according to claim 1 further comprising:

a second work table for supporting another semiconductor device to be wire bonded; and a second work table conveyance system for translating the another semiconductor device along a third horizontal axis.

5. The wire bonding machine according to claim 4 wherein the second and third axes are substantially parallel.

6. The wire bonding machine according to claim 4 further comprising:

a camera for capturing position data of a semiconductor device to be wire bonded; and a camera conveyance system for translating the camera along a horizontal axis.

7. The wire bonding machine according to claim 6 further comprising:

a second camera for capturing position data of a semiconductor device to be wire bonded, the second camera being secured to the bonding head.

8. A wire bonding machine according to claim 1 wherein the semiconductor device is positioned in a magazine with at least one other semiconductor device.

9. A wire bonding machine according to claim 8 further comprising a magazine handler for feeding the magazine to the work table conveyance system.

10. The wire bonding machine according to claim 1 further comprising:

a camera for capturing position data of a semiconductor device to be wire bonded; and a camera conveyance system for translating the camera along a horizontal axis.

11. The wire bonding machine according to claim 10 further comprising a second camera for capturing position data of a semiconductor device to be wire bonded, the second camera being secured to the bonding head.

12. A method of bonding a wire to a device to be wire bonded, the method comprising the steps of:

(1) supporting a device to be wire bonded on a work table;

(2) positioning the device into a bonding position prior to a wire bonding operation;

during the wire bonding operation wherein the wire bonding operation is the process of attaching a conductive wire between bonding locations on the device; wherein the moving of the device in step (3) is distinct from the positioning of the device in step (2);

(4) moving a wire bonding head with a bonding head conveyance system along a second horizontal axis and along a vertical axis during the wire bonding operation, wherein the second horizontal axis is different from the first horizontal axis; and (5) bonding a wire to the device.

13. The method of claim 12 wherein the steps of moving the device along a first horizontal axis and moving a wire bonding head along a second horizontal axis comprise moving the device and the wire bonding head in a direction substantially orthogonal to one another.

14. The method of claim 12 further comprising the steps of:

moving another device to be wire bonded along a third horizontal axis with another work table conveyance system;

moving the wire bonding head with the bonding head conveyance system along the second horizontal axis and along the vertical axis toward the another device; and bonding a wire to the another device.

* * * * *

UNITED STATES PATENT AND TRADEMARK OFFICE
CERTIFICATE OF CORRECTION

| | | |
|---|---|---|
| PATENT NO. | : 7,320,424 B2 | Page 1 of 1 |
| APPLICATION NO. | : 11/092399 | |
| DATED | : January 22, 2008 | |
| INVENTOR(S) | : David T. Beatson and E. Walter Frasch | |

It is certified that error appears in the above-identified patent and that said Letters Patent is hereby corrected as shown below:

At column 8, Claim 12, "A method of bonding a wire to a device to be wire bonded, the method comprising the steps of: (1)supporting a device to be wire bonded on a work table; (2) positioning the device into a bonding position prior to a wire bonding operation; during the wire bonding operation wherein the wire bonding operation is the process of attaching a conductive wire between bonding locations on the device; wherein the moving of the device in step (3) is distinct from the positioning of the device in step (2); (4) moving a wire bonding head with a bonding head conveyance system along a second horizontal axis and along a vertical axis during the wire bonding operation, wherein the second horizontal axis is different from the first horizontal axis; and (5) bonding a wire to the device." should read -- A method of bonding a wire to a device to be wire bonded, the method comprising the steps of: (1) supporting a device to be wire bonded on a work table; (2) positioning the device into a bonding position prior to a wire bonding operation; (3) moving the device along a first horizontal axis with a work table conveyance system during the wire bonding operation wherein the wire bonding operation is the process of attaching a conductive wire between bonding locations on the device, wherein the moving of the device in step (3) is distinct from the positioning of the device in step (2); (4) moving a wire bonding head with a bonding head conveyance system along a second horizontal axis and along a vertical axis during the wire bonding operation, wherein the second horizontal axis is different from the first horizontal axis; and (5) bonding a wire to the device. --

Signed and Sealed this

Twenty-second Day of July, 2008

JON W. DUDAS
*Director of the United States Patent and Trademark Office*

UNITED STATES PATENT AND TRADEMARK OFFICE
CERTIFICATE OF CORRECTION

PATENT NO.       : 7,320,424 B2
APPLICATION NO.  : 11/092399
DATED            : January 22, 2008
INVENTOR(S)      : David T. Beatson and E. Walter Frasch It is certified that error appears in the above-identified patent and that said Letters Patent is hereby corrected as shown below:

At column 8, Claim 12, lines 15-32, "A method of bonding a wire to a device to be wire bonded, the method comprising the steps of: (1)supporting a device to be wire bonded on a work table; (2) positioning the device into a bonding position prior to a wire bonding operation; during the wire bonding operation wherein the wire bonding operation is the process of attaching a conductive wire between bonding locations on the device; wherein the moving of the device in step (3) is distinct from the positioning of the device in step (2); (4) moving a wire bonding head with a bonding head conveyance system along a second horizontal axis and along a vertical axis during the wire bonding operation, wherein the second horizontal axis is different from the first horizontal axis; and (5) bonding a wire to the device." should read -- A method of bonding a wire to a device to be wire bonded, the method comprising the steps of: (1) supporting a device to be wire bonded on a work table; (2) positioning the device into a bonding position prior to a wire bonding operation; (3) moving the device along a first horizontal axis with a work table conveyance system during the wire bonding operation wherein the wire bonding operation is the process of attaching a conductive wire between bonding locations on the device, wherein the moving of the device in step (3) is distinct from the positioning of the device in step (2); (4) moving a wire bonding head with a bonding head conveyance system along a second horizontal axis and along a vertical axis during the wire bonding operation, wherein the second horizontal axis is different from the first horizontal axis; and (5) bonding a wire to the device. --

This certificate supersedes the Certificate of Correction issued July 22, 2008.

Signed and Sealed this

Twelfth Day of August, 2008

JON W. DUDAS
*Director of the United States Patent and Trademark Office*